US012164838B1

(12) United States Patent
Qi et al.

(10) Patent No.: US 12,164,838 B1
(45) Date of Patent: Dec. 10, 2024

(54) INTELLIGENT DRAWING-MODEL CHECKING METHOD AND APPARATUS

(71) Applicant: SHENZHEN XUMI YUNTU SPACE TECHNOLOGY CO., LTD., Shenzhen (CN)

(72) Inventors: Shuang Qi, Shenzhen (CN); Qinghua Chen, Shenzhen (CN); Lianqiang Li, Shenzhen (CN); Jiadi Xu, Shenzhen (CN); Jia Wang, Shenzhen (CN)

(73) Assignee: SHENZHEN XUMI YUNTU SPACE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/690,750

(22) PCT Filed: Dec. 24, 2021

(86) PCT No.: PCT/CN2021/141290
§ 371 (c)(1),
(2) Date: Mar. 11, 2024

(87) PCT Pub. No.: WO2023/040113
PCT Pub. Date: Mar. 23, 2023

(30) Foreign Application Priority Data

Sep. 14, 2021 (CN) ........................ 202111071644.6

(51) Int. Cl.
*G06F 30/12* (2020.01)
*G06F 30/13* (2020.01)

(52) U.S. Cl.
CPC .............. *G06F 30/12* (2020.01); *G06F 30/13* (2020.01)

(58) Field of Classification Search
CPC ....................................................... G06F 30/12
USPC ............................................................ 703/1
See application file for complete search history.

(56) References Cited

U.S. PATENT DOCUMENTS 10,186,049 B1 * 1/2019 Boardman ................ G06T 7/55
2008/0062195 A1 3/2008 Brown et al.
2014/0282328 A1 9/2014 Fried et al.

FOREIGN PATENT DOCUMENTS

CN 102929999 A 2/2013
CN 105046456 A 11/2015
(Continued)

OTHER PUBLICATIONS

Jian Li, The research on coal mine engineering drawing system, Thesis for Degree Liaoning Technical University, 2002, pp. 1-106.
(Continued)

*Primary Examiner* — Eric D Lee
(74) *Attorney, Agent, or Firm* — Bayramoglu Law Offices LLC

(57) ABSTRACT

An intelligent drawing-model checking method includes: acquiring a first drawing model and a second drawing model, determining an alignment base point according to the first drawing model and the second drawing model, and aligning the first drawing model and the second drawing model into a same reference coordinate system using the alignment base point; determining axis vectors in the first drawing model and the second drawing model according to a standard axis net, calculating a cosine value between the axis vectors, and rotationally aligning at least one of the first drawing model and the second drawing model according to the cosine value; and displaying lines and points in the first drawing model after the rotational alignment in a first color, displaying lines and points in the second drawing model after the rotational alignment in a second color, and checking the drawing models by color mixing distinguishing.

15 Claims, 6 Drawing Sheets drawing comparison principle diagram
drawing A
MDS
drawing B
MDS
consistent?
No
Yes
base point positioning
no difference
cosine similarity
matrix transformation and drawing alignment
color mixing
drawing A
drawing B
the same positions are yellow

(56) References Cited

FOREIGN PATENT DOCUMENTS

| | | | |
|---|---|---|---|
| CN | 106127859 | A | 11/2016 |
| CN | 107045526 | A | 8/2017 |
| CN | 109325214 | A | 2/2019 |
| CN | 111079218 | A | 4/2020 |
| CN | 111339588 | A | 6/2020 |
| CN | 111627099 | A | 9/2020 |
| CN | 111831873 | A | 10/2020 |
| CN | 113515792 | A | 10/2021 |
| EP | 3608841 | A1 | 2/2020 |
| WO | 2018091100 | A1 | 5/2018 |
| WO | 2020065656 | A1 | 4/2020 |

OTHER PUBLICATIONS

Yingrui Shi, Research on Intelligent Inspection of Construction Safety in Building Main Structure Based on BIM, Master Thesis, China University of Mining and Technology, 2020, pp. 1-101.

Ke-Zhang Chen, et al., Intelligent approaches for generating assembly drawings from 3-D computer models of mechanical products, Computer-Aided Design, 2002, pp. 347-355, vol. 34.

Tong Lu, et al., A new recognition model for electronic architectural drawings, Computer-Aided Design, 2005, pp. 1053-1069, vol. 37.

Mengtian Yin, et al., Automatic layer classification method-based elevation recognition in architectural drawings for reconstruction of 3D BIM models, Automation in Construction, 2020, pp. 1-19, vol. 113, 103082.

* cited by examiner

S501 acquiring a first drawing model and a second drawing model obtained by modifying the first drawing model, and determining an alignment base point according to the first drawing model and the second drawing model

S502 aligning the first drawing model and the second drawing model into a same reference coordinate system based on the alignment base point, and respectively displaying the first drawing model and the second drawing model in different layers in a drawing model corresponding to the reference coordinate system

S503 determining corresponding axis vectors in the first drawing model and the second drawing model according to a preset standard axis net, calculating a cosine value between the axis vectors corresponding to the first drawing model and the second drawing model, and rotationally aligning at least one of the first drawing model and the second drawing model according to the cosine value

S504 sequentially traversing geometric elements in the first drawing model and the second drawing model after the rotational alignment to calculate a vector of each geometric element, and respectively calculating second cosine values between the vectors of the closest geometric elements in the first drawing model and the second drawing model based on the vectors of the geometric elements

S505 taking the geometric elements with the second cosine values larger than a preset threshold as the geometric elements with different positions, rendering the geometric elements with different positions, and checking the drawing models according to the rendered geometric elements

FIG. 5

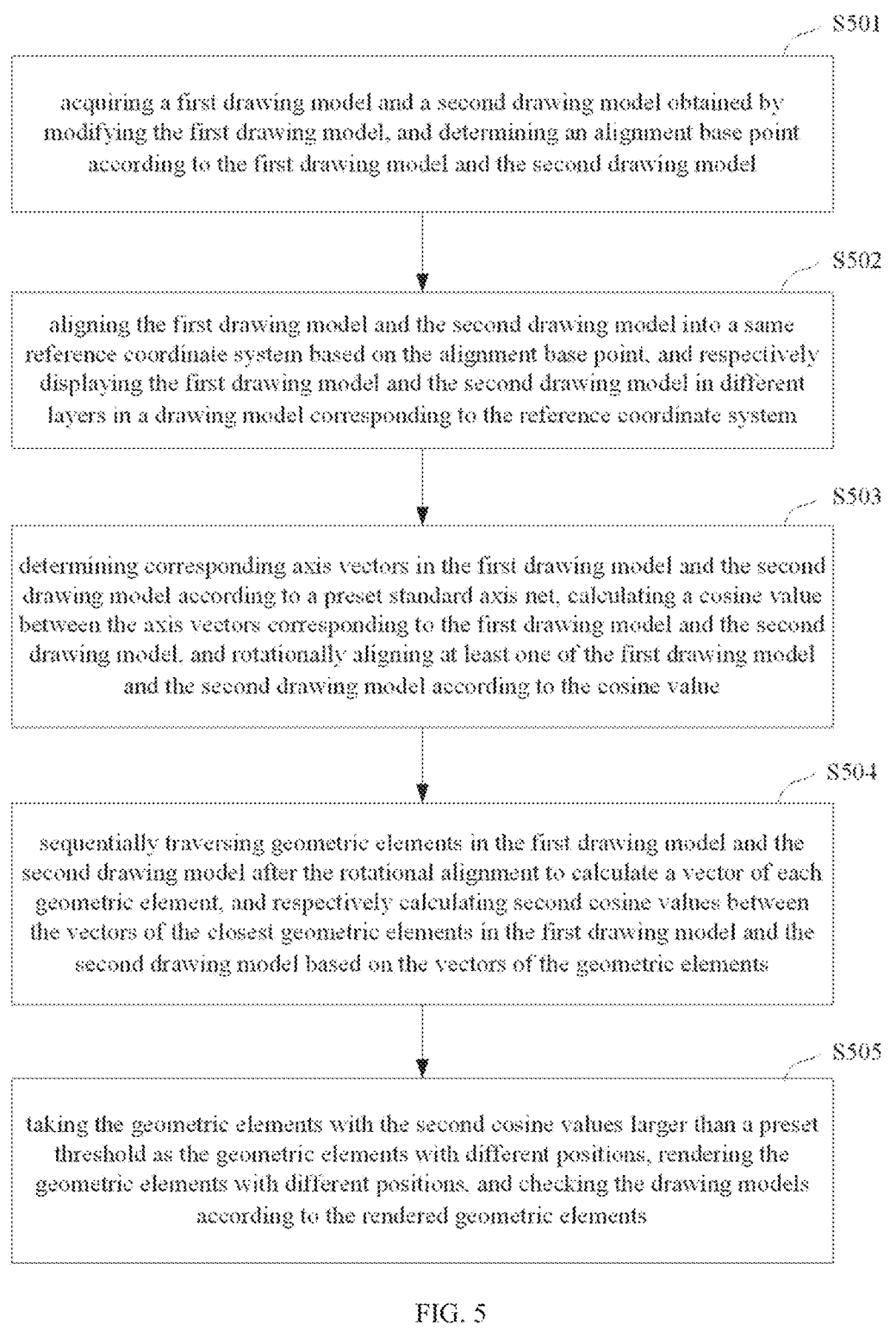

INTELLIGENT DRAWING-MODEL CHECKING METHOD AND APPARATUS

CROSS REFERENCE TO THE RELATED APPLICATIONS

This application is the national phase entry of International Application No. PCT/CN2021/141290, filed on Dec. 24, 2021, which is based upon and claims priority to Chinese Patent Application No. 202111071644.6, filed on Sep. 14, 2021, the entire contents of which are incorporated herein by reference.

TECHNICAL FIELD

The present disclosure relates to the field of drawing-model checking technologies, and in particular, to an intelligent drawing-model checking method and apparatus.

BACKGROUND

During construction of a construction project, a large number of drawing models are generated from design of a construction drawing to a completion stage, sometimes the drawing models in the construction process are required to be modified and adjusted according to actual construction requirements, and the modification and adjustment of the drawing models are collectively called changes. In an actual scenario, after the drawing model is modified, whether a designer modifies a proposed problem and whether the modification is implemented in the drawing model are required to be further checked, so as to achieve the purpose of checking the drawing model.

In the prior art, all problem items after the change are required to be manually checked against the drawing model, and since there are many problems to be checked, a checker is required to compare the drawing models before and after the modification for differences in sequence until the whole drawing model is checked once. Therefore, the manual checking mode greatly increases a workload, a checking time is long, missing and error problems are prone to occur, and since the difference between the drawing models before and after the modification cannot be visually presented, the checker cannot rapidly position a modified region, thus reducing an efficiency of checking the drawing model.

SUMMARY

In view of this, embodiments of the present disclosure provide an intelligent drawing-model checking method and apparatus, so as to solve the problems in the prior art that a workload of manual checking is large, a time consumed for checking is long, and a modified region cannot be quickly positioned, thus reducing an efficiency of checking a drawing model.

In a first aspect of the embodiments of the present disclosure, there is provided an intelligent drawing-model checking method, including: acquiring a first drawing model and a second drawing model obtained by modifying the first drawing model, and determining an alignment base point according to the first drawing model and the second drawing model; aligning the first drawing model and the second drawing model into a same reference coordinate system based on the alignment base point, and respectively displaying the first drawing model and the second drawing model in different layers in a drawing model corresponding to the reference coordinate system; determining corresponding axis vectors in the first drawing model and the second drawing model according to a preset standard axis net, calculating a cosine value between the axis vectors corresponding to the first drawing model and the second drawing model, and rotationally aligning at least one of the first drawing model and the second drawing model according to the cosine value; and displaying lines and points in the first drawing model after the rotational alignment in a first color, displaying lines and points in the second drawing model after the rotational alignment in a second color, the first color and the second color being different colors, and checking the drawing models by color mixing distinguishing.

In a second aspect of the embodiments of the present disclosure, there is provided an intelligent drawing-model checking method, including: acquiring a first drawing model and a second drawing model obtained by modifying the first drawing model, and determining an alignment base point according to the first drawing model and the second drawing model; aligning the first drawing model and the second drawing model into a same reference coordinate system based on the alignment base point, and respectively displaying the first drawing model and the second drawing model in different layers in a drawing model corresponding to the reference coordinate system; determining corresponding axis vectors in the first drawing model and the second drawing model according to a preset standard axis net, calculating a first cosine value between the axis vectors corresponding to the first drawing model and the second drawing model, and rotationally aligning at least one of the first drawing model and the second drawing model according to the first cosine value; sequentially traversing geometric elements in the first drawing model and the second drawing model after the rotational alignment to calculate a vector of each geometric element, and respectively calculating second cosine values between the vectors of the closest geometric elements in the first drawing model and the second drawing model based on the vectors of the geometric elements; and taking the geometric elements with the second cosine values larger than a preset threshold as the geometric elements with different positions, rendering the geometric elements with different positions, and checking the drawing models according to the rendered geometric elements.

In a third aspect of the embodiments of the present disclosure, there is provided an intelligent drawing-model checking apparatus, including: an acquiring module configured to acquire a first drawing model and a second drawing model obtained by modifying the first drawing model, and determine an alignment base point according to the first drawing model and the second drawing model; an aligning module configured to align the first drawing model and the second drawing model into a same reference coordinate system based on the alignment base point, and respectively display the first drawing model and the second drawing model in different layers in a drawing model corresponding to the reference coordinate system; a rotating module configured to determine corresponding axis vectors in the first drawing model and the second drawing model according to a preset standard axis net, calculate a cosine value between the axis vectors corresponding to the first drawing model and the second drawing model, and rotationally align at least one of the first drawing model and the second drawing model according to the cosine value; and a checking module configured to display lines and points in the first drawing model after the rotational alignment in a first color, display lines and points in the second drawing model after the rotational alignment in a second color, the first color and the second color and the second color being different colors, and check the drawing models by color mixing distinguishing.

In a fourth aspect of the embodiments of the present disclosure, there is provided an intelligent drawing-model checking apparatus, including: an acquiring module configured to acquire a first drawing model and a second drawing model obtained by modifying the first drawing model, and determine an alignment base point according to the first drawing model and the second drawing model; an aligning module configured to align the first drawing model and the second drawing model into a same reference coordinate system based on the alignment base point, and respectively display the first drawing model and the second drawing model in different layers in a drawing model corresponding to the reference coordinate system; a rotating module configured to determine corresponding axis vectors in the first drawing model and the second drawing model according to a preset standard axis net, calculate a first cosine value between the axis vectors corresponding to the first drawing model and the second drawing model, and rotationally align at least one of the first drawing model and the second drawing model according to the first cosine value; a calculating module configured to sequentially traverse geometric elements in the first drawing model and the second drawing model after the rotational alignment to calculate a vector of each geometric element, and respectively calculate second cosine values between the vectors of the closest geometric elements in the first drawing model and the second drawing model based on the vectors of the geometric elements; and a checking module configured to take the geometric elements with the second cosine values larger than a preset threshold as the geometric elements with different positions, render the geometric elements with different positions, and check the drawing models according to the rendered geometric elements.

At least one of the above technical solutions adopted in the embodiments of the present disclosure can achieve the following beneficial effects.

The first drawing model and the second drawing model obtained by modifying the first drawing model are acquired, and the alignment base point is determined according to the first drawing model and the second drawing model; the first drawing model and the second drawing model are aligned into the same reference coordinate system based on the alignment base point, and the first drawing model and the second drawing model are respectively displayed in different layers in the drawing model corresponding to the reference coordinate system; the corresponding axis vectors in the first drawing model and the second drawing model are determined according to the preset standard axis net, the cosine value between the axis vectors corresponding to the first drawing model and the second drawing model is calculated, and at least one of the first drawing model and the second drawing model is rotationally aligned according to the cosine value; and the lines and the points in the first drawing model after the rotational alignment are displayed in the first color, the lines and the points in the second drawing model after the rotational alignment are displayed in the second color, the first color and the second color being different colors, and the drawing models are checked by color mixing distinguishing. With the present disclosure, an intelligent drawing model check can be realized, the workload and time consumption of the drawing model check can be reduced, missing and error problems can be avoided, and a difference between the drawing models before and after modification can be visually presented, so as to help a checker to quickly position the modified region and improve the efficiency of checking the drawing model.

BRIEF DESCRIPTION OF THE DRAWINGS

In order to more clearly illustrate the technical solutions in the embodiments of the present disclosure, the accompanying drawings used in the description of the embodiments or the prior art will be briefly introduced below. It is apparent that, the accompanying drawings in the following description are only some embodiments of the present disclosure, and other drawings can be obtained by those of ordinary skill in the art from the provided drawings without creative efforts.

FIG. 5 is a schematic flowchart of an intelligent drawing-model checking method according to a second embodiment of the present disclosure;

DETAILED DESCRIPTION OF THE EMBODIMENTS

Figure 1:
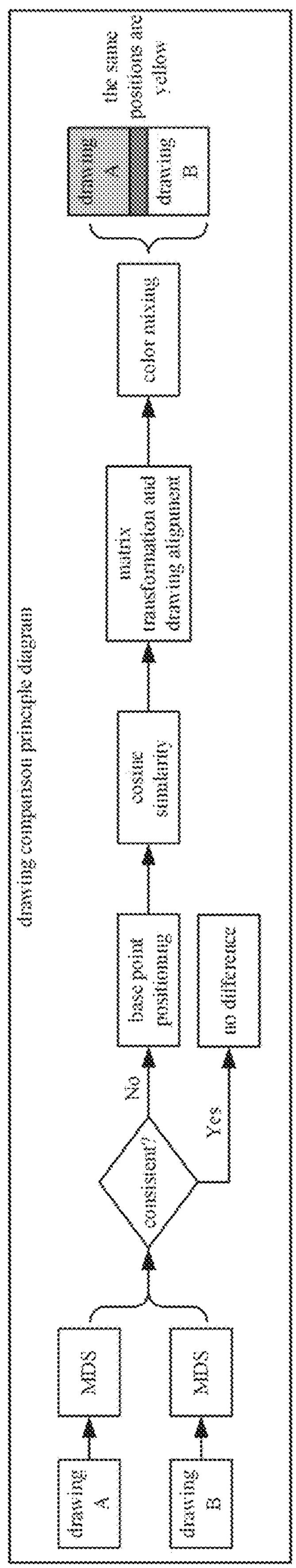
FIG. 1 is a schematic diagram of an overall processing flow of a technical solution corresponding to an embodiment of the present disclosure.

In the following description, for the purpose of illustration instead of limitation, specific details such as a particular system structure and a technology are provided to make the embodiments of the present disclosure understood thoroughly. However, it should be understood by those skilled in the art that the present disclosure can also be implemented in other embodiments without the specific details. In other cases, detailed description of well-known systems, apparatuses, circuits and methods is omitted, so that the present disclosure is described without being impeded by unnecessary details.

In the field of building construction, whole flow operations of the whole building construction may involve a large number of drawing models (such as drawings or models), for example, design drawings, construction drawings, completion drawings, or the like, and review and modification of the drawings may be involved in each stage of the building construction process and can be regarded as changes of the drawings. Geometric figures in local regions of the drawings before and after the change may vary, and therefore, a checker is required to check the drawings before and after the change to inspect whether a designer modifies a proposed problem and implements the modification in the drawings or the models, thereby completing the check of the drawings.

In the related art, the checker is usually required to manually open the drawing or the model based on a problem list corresponding to the modified drawing, and sequentially compare the geometric figures in the drawings before and after the modification according to the problem list to be reviewed until all the modification is checked once. However, when there are many reviewed problems, the manual check mode increases a workload of the checker, several days may be required for one check, and the manual check is prone to have missing and error problems. In addition, since differences between the drawing models before and after the modification cannot be visually presented, the checker cannot obviously distinguish the drawings before and after the modification and cannot rapidly position a modified region, thus reducing an efficiency of checking the drawing models.

In view of the above problems in the prior art, it is desirable to provide an intelligent drawing-model checking solution which can intelligently present the difference between the drawing models before and after the modification, assist the checker in quickly positioning the modified region, reduce the workload of the manual check, reduce the time consumption of the drawing model check, avoid the missing and error problems in the manual check, and improve the efficiency of checking the drawing models. An overall implementation process of the technical solution of the embodiment of the present disclosure is described below with reference to the accompanying drawings, and FIG. 1 is a schematic diagram of an overall processing flow of the technical solution corresponding to the embodiment of the present disclosure. As shown in FIG. 1, the overall flow of the technical solution may be specifically as follows.

Drawings before and after modification are acquired, and the drawings before and after the modification correspond to different versions; that is, the drawing A is the version before the modification, and the drawing B is the version after the modification; firstly, hash values (such as MD5 values) of the two drawing files are calculated by using a hash operation, the MD5 values of the two drawings are compared to judge whether the MD5 values are consistent, and when the MD5 values are consistent, the drawings are not modified; that is, contents of the two drawings are completely consistent, such that the two drawings are not required to be further checked.

When the MD5 values are inconsistent, the drawing B is inconsistent with the drawing A; that is, the drawing B is obtained by modifying the drawing A, and therefore, it is necessary to further determine modified regions and figures in the drawings; coordinates of the two drawings are positioned under a same coordinate system by using a base point; that is, coordinate systems of the two drawings are positioned by using the base point, such that the coordinate systems of the two drawings are kept consistent; further, axis vectors of preset axis nets in the two drawings are calculated, cosine similarity of the two axis nets is calculated based on the axis vectors, whether positions of the two axis nets are aligned is judged according to the cosine similarity of the axis nets, and if the positions are not aligned (that is, a cosine value is greater than 0), the drawing A or the drawing B is rotated by a certain angle or radian according to the cosine value, such that the axis nets of the two drawings are aligned.

Further, based on the drawing A and the drawing B after the alignment of the axis nets, changed positions are distinguished using a color mixing principle; for example, the color of geometric elements in the drawing A is red, the color of geometric elements in the drawing B is blue, and after the drawing A and the drawing B are overlapped under a same drawing model, the geometric elements at the same position become yellow, and the geometric elements at different positions still present the original colors. Based on the color difference, the geometric elements with positions changed in the drawing models before and after the modification can be visually presented, and a checker can be assisted in quickly positioning the modified region.

It should be noted that an executive body in the embodiment of the present disclosure may be a terminal used by the checker and provided with a drawing model reviewing system; for example, the terminal may be a device with networking and displaying functions, such as a mobile phone, a tablet, a PC and a smart watch, the drawing model reviewing system in the embodiment of the present disclosure includes software or a graphic engine for rendering and displaying the drawing, and the above description of the application scenario and the executive body does not limit the solution.

First Embodiment

Figure 2:
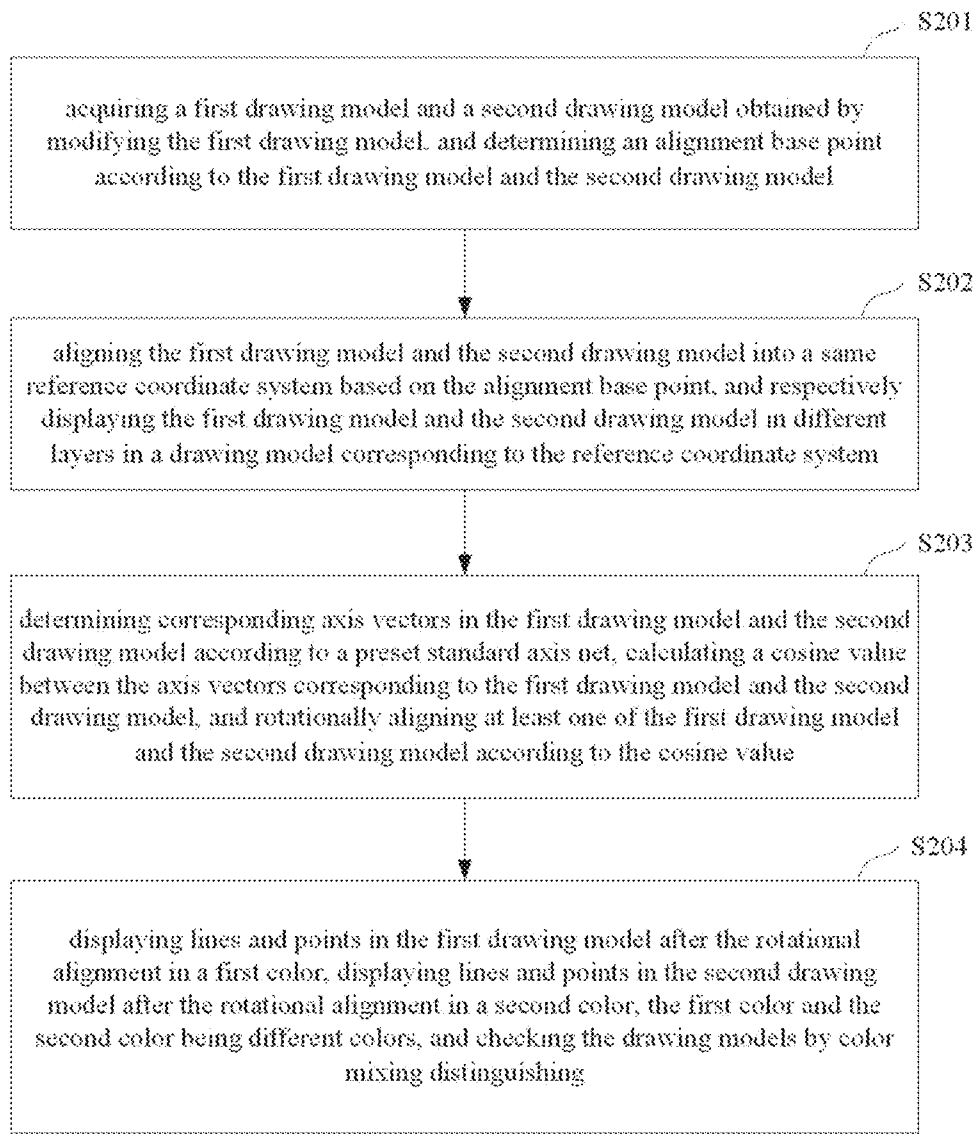
FIG. 2 is a schematic flowchart of an intelligent drawing-model checking method according to a first embodiment of the present disclosure.

FIG. 2 is a schematic flowchart of an intelligent drawing-model checking method according to a first embodiment of the present disclosure. The intelligent drawing-model checking method in FIG. 2 may be executed by a server or a terminal, and the server may be a background server corresponding to a drawing model reviewing system. As shown in FIG. 2, the intelligent drawing-model checking method may specifically include:

S201: acquiring a first drawing model and a second drawing model obtained by modifying the first drawing model, and determining an alignment base point according to the first drawing model and the second drawing model;

S202: aligning the first drawing model and the second drawing model into a same reference coordinate system based on the alignment base point, and respectively displaying the first drawing model and the second drawing model in different layers in a drawing model corresponding to the reference coordinate system;

S203: determining corresponding axis vectors in the first drawing model and the second drawing model according to a preset standard axis net, calculating a cosine value between the axis vectors corresponding to the first drawing model and the second drawing model, and rotationally aligning at least one of the first drawing model and the second drawing model according to the cosine value; and S204: displaying lines and points in the first drawing model after the rotational alignment in a first color, displaying lines and points in the second drawing model after the rotational alignment in a second color, the first color and the second color being different colors, and checking the drawing models by color mixing distinguishing.

Specifically, in the field of design and construction of construction projects, drawing models may be regarded as some drawing model files, such as design drawing models, construction drawing models, completion drawing models and acceptance drawing models; in practical application, the drawing models may be two-dimensional drawing model files or three-dimensional model files; that is, the drawing models include drawings and models. The first drawing model (i.e., an original drawing model file before modification) is made using drawing software or a graphic engine, for example, a construction drawing made using AutoCAD, and an initial format of a derived construction drawing model is DWG. The format of the drawing model is determined by the drawing software or the graphic engine, such as DWG, RVT, SKP and 3DS, DWG corresponds to a two-dimensional drawing file, and RVT, SKP, 3DS, or the like, correspond to three-dimensional model files.

Further, the alignment base point refers to a reference coordinate point used when two drawings are aligned into the same coordinate system, and in practical application, the alignment base point may be a coordinate origin in the first drawing model or the second drawing model, or an intersection point corresponding to a certain axis net in the first drawing model or the second drawing model serves as the base point used in the alignment; certainly, the alignment may be performed using other coordinate points, as long as it is ensured that the coordinate systems of the two drawing models can be aligned using the alignment base point, and the alignment base point in the embodiment of the present disclosure is not limited to the above coordinate point.

The axis net is a net consisting of building axes drawn in a building drawing, and includes a linear axis net, an oblique axis net, an arc axis net, or the like, and the axis net consists of positioning axes (such as central lines of walls or columns in a building structure), mark sizes (such as marked distances between the positioning axes of a building) and axis numbers. The axis net is a main body frame for building drawing, main supporting members of the building are positioned and arranged according to the axis net to achieve an orderly effect, and the axis number is a number defined for the axis. Since the axis net is constant in the drawing and is a basic ruler for designing the drawing, the axis net can be used as a unified reference system and a reference for position alignment.

Here, the second drawing model is a complete drawing model file obtained by modifying the first drawing model, and therefore, the second drawing model includes both a geometric figure corresponding to a modified part and a geometric figure corresponding to an unmodified part; for example, only a water channel figure in the first drawing model is modified, a drainage inclination of a water channel in the first drawing model is modified from 5° to 7°, and at this point, the water channel with the inclination of 7° is directly displayed in the second drawing model obtained after the modification, and the water channel with the inclination of 5° is still displayed in the first drawing model before the modification. According to the embodiment of the present disclosure, the first drawing model and the second drawing model are aligned to the same coordinate system using the alignment base point and the cosine value of the axis net, the positions of the axis nets are overlapped, and in the color mixing mode, the figures at the same position show the same color, and the figures at different positions show the respective original colors, thereby facilitating the checker to quickly position the modified region.

In the technical solution according to the embodiment of the present disclosure, by analyzing the drawing models of different versions before and after the modification, the first drawing model and the second drawing model are aligned into the same reference coordinate system by utilizing the alignment base point, so as to ensure that the rotational alignment is carried out under the same coordinate system; then, the axis vectors of the same axis in the first drawing model and the second drawing model are calculated according to the standard axis net, the cosine value is determined based on the axis vectors, and the axis nets in the first drawing model and the second drawing model are aligned according to the cosine value; since positions of the axis nets before and after the drawing is modified are unchanged, the alignment of the axis nets means that overlapped parts in the drawings have no rotation amount in the space; finally, the modified content presents differentiated colors in the color mixing mode, such that the checker can be assisted in quickly positioning the modified region, and the efficiency of checking the drawing models is improved.

In some embodiments, before the determining an alignment base point according to the first drawing model and the second drawing model, the method further includes: performing a hash operation on the first drawing model and the second drawing model to obtain a first hash value and a second hash value corresponding to the first drawing model and the second drawing model respectively, and comparing the first hash value with the second hash value; and when the first hash value and the second hash value are different, performing a check operation on the second drawing model.

Specifically, the first drawing model and the second drawing model are saved as drawing files, hash values of the first drawing model file and the second drawing model file are calculated respectively by using the hash operation, and in practical application, MD5 (Message-Digest Algorithm 5) may be adopted in the hash operation. The MD5 is a hash algorithm widely used in computers, and is a widely used cryptographic hash function which can generate a 128-bit (16-byte) hash value; that is, a fixed MD5 value can be calculated for each drawing model file by using an MD5 verification program, the MD5 value is equivalent to the ID of the drawing model file, the MD5 value is unique, and if the drawing model file is modified, the MD5 value changes.

Here, in the embodiment of the present disclosure, the MD5 values of the first and second drawing models are calculated, whether the drawing models are modified according to the consistency of the MD5 values, and if the MD5 values are consistent, the drawing models are not modified, and if the MD5 values are inconsistent, the content of the drawing models is modified. A processing process of the MD5 mainly includes the following four steps: processing an original text, setting an initial value, circularly processing and splicing results.

In some embodiments, the determining an alignment base point according to the first drawing model and the second drawing model includes: taking a coordinate point in a world coordinate system corresponding to a coordinate origin in the first drawing model or the second drawing model as the alignment base point; or selecting at least one axis net from the first drawing model or the second drawing model as an alignment axis net, and taking an axis intersection point in the alignment axis net as the alignment base point; the alignment axis net and the standard axis net being a same axis net or different axis nets, and the alignment axis net or the standard axis net including at least one group of horizontal axis and longitudinal axis.

Specifically, in order to align the drawing model of the original version (i.e., the first drawing model) with the drawing model of the modified version (i.e., the second drawing model), the two drawing models are required to be placed in the same reference system first, and since the first drawing model and the second drawing model correspond to respective coordinate systems, the coordinate systems of the two drawing models are required to be overlapped using the alignment base point, such that the two drawing models can be aligned in the same coordinate system.

Further, when the alignment base point is determined, the coordinate origin in the first or second drawing model may be selected as the alignment base point, or the axis intersection point in the alignment axis net may be taken as the alignment base point, and when the coordinate origin is taken as the alignment base point, the coordinate of the coordinate origin of one drawing model in the world coordinate system is determined, the coordinate is used as the alignment base point, and then, the coordinate origin of the other drawing model is moved to the alignment base point.

in some embodiments, when the axis intersection point in the alignment axis net is used as the alignment base point, the aligning the first drawing model and the second drawing model into a same reference coordinate system based on the alignment base point includes: determining a coordinate corresponding to a first axis intersection point in the first drawing model, and determining a coordinate corresponding to a second axis intersection point in the second drawing model; and calculating an intersection point vector between the first axis intersection point and the second axis intersection point according to the coordinate of the first axis intersection point and the coordinate of the second axis intersection point, the intersection point vector being used for indicating a moving distance and direction of the first drawing model or the second drawing model when the first axis intersection point and the second axis intersection point are aligned; the first axis intersection point and the second axis intersection point being intersection points formed by the axes with same axis numbers.

Specifically, since the axis nets of the drawing models of the previous and later versions are not changed, one axis net in the drawing model may be selected as the axis net for alignment, and the axis intersection point of the alignment axis net is used as the alignment base point; for example: the axis net A-1 may be selected as the alignment axis net, and then, the intersection point between the horizontal axis A and the longitudinal axis 1 is the alignment base point.

Further, after the axis intersection point is determined, the corresponding coordinates of the axis intersection point in the two drawing models are determined, the intersection point vector is calculated based on the coordinates of the axis intersection point in the two drawing models, and the first drawing model or the second drawing model is moved by using the intersection point vector. It should be noted that if a vector from an axis intersection point in the first drawing model to an axis intersection point in the second drawing model is used as the intersection point vector, the intersection point vector represents a distance and a direction when the first drawing model is moved to the second drawing model, and a converse vector represents a distance and a direction when the second drawing model is moved to the first drawing model.

Figure 3:
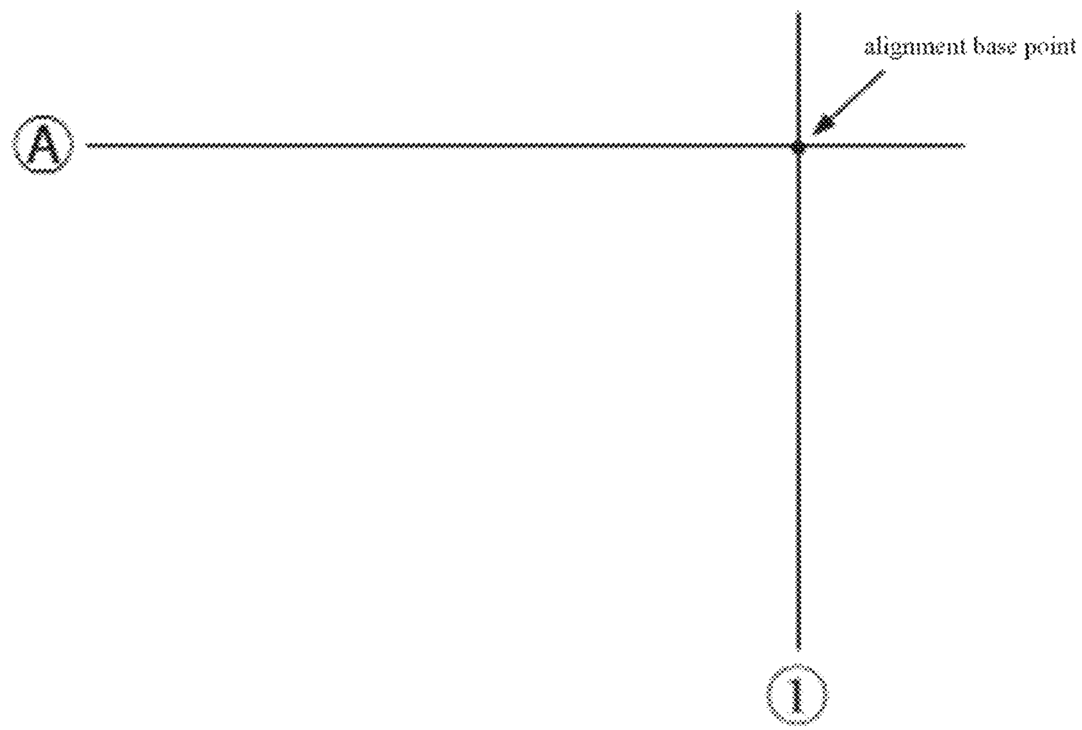
FIG. 3 is a schematic diagram of determination of an alignment base point based on an axis intersection point in an embodiment of the present disclosure.

FIG. 3 is a schematic diagram of determination of the alignment base point based on the axis intersection point in the embodiment of the present disclosure. As shown in FIG. 3, for the axis intersection point, the alignment base point is determined according to the axis net A-1 in the first drawing model or the second drawing model; that is, the intersection point between the horizontal axis A and the longitudinal axis 1 is used as the alignment base point, and the first drawing model and the second drawing model can be aligned to the same reference coordinate system based on the alignment base point.

In some embodiments, a drawing coordinate system corresponding to the first drawing model is used as the reference coordinate system, or a drawing coordinate system corresponding to the second drawing model is used as the reference coordinate system, or a drawing coordinate system corresponding to a third drawing model except the first drawing model and the second drawing model is used as the reference coordinate system.

Specifically, when the drawing models are aligned based on the alignment base point, the drawing coordinate system corresponding to the first drawing model or the drawing coordinate system corresponding to the second drawing model or another drawing coordinate system may be used as the reference coordinate system, the drawing of the other drawing model is moved to the drawing of the drawing model with the drawing coordinate system as the reference coordinate system, and the drawings are displayed in different layers. That is, one drawing model may be moved to the other drawing model according to the alignment base point, and the drawing models are displayed in different layers, or the two drawing models may be moved to another drawing model at the same time and displayed in different layers.

In the technical solution according to the embodiment of the present disclosure, the drawing coordinates are aligned; that is, the two drawings are aligned using the coordinate origins or the axis intersection points in the drawings, such that the local coordinate systems of the two drawings are combined together, point alignment of the drawings is realized, the geometric figures in different drawings can be guaranteed to be compared under the same coordinate system, and a unified coordinate system is established for the subsequent calculation of the axis vector and judgment of the rotation amount.

In some embodiments, the determining corresponding axis vectors in the first drawing model and the second drawing model according to a preset standard axis net includes: traversing the axis nets in the first drawing model and the second drawing model according to an axis number corresponding to the preset standard axis net, taking an axis net in the first drawing model corresponding to the axis number of the standard axis net as a first standard axis net, and taking an axis net in the second drawing model corresponding to the axis number of the standard axis net as a second standard axis net; and acquiring starting point coordinates and end point coordinates which correspond to horizontal axes or longitudinal axes in the first standard axis net and the second standard axis net respectively, and calculating the axis vectors corresponding to the same axes in the first standard axis net and the second standard axis net respectively according to the starting point coordinates and the end point coordinates.

Specifically, after the two drawing models are aligned in the same coordinate system using the alignment base point, since the drawing models before and after the modification may rotate, it is necessary to further determine the rotation amount of the drawing models based on the axis net, so as to achieve the rotational alignment of the same figures. That is, one axis net in the first drawing model or the second drawing model is used as the standard axis net; for example, the axis net A-1 is used as the standard axis net, and then, the corresponding axis number of the standard axis net is A and 1.

Further, all the axis nets in the first drawing model and the second drawing model are traversed according to the axis number, coordinate positions of the standard axis net in the first drawing model and the second drawing model are determined, and then, the axis vector between the two axis nets is calculated according to a certain axis (such as the horizontal axis A or the longitudinal axis 1) in the standard axis net. For example, when the axis vector is calculated by using the axis A in the axis net A-1, the starting point coordinates and the end point coordinates of the axis A in the first drawing model and the second drawing model are determined, and the corresponding axis vectors of the axis A in the first drawing model and the second drawing model are calculated according to the starting point coordinates and the end point coordinates of the axis A, such that a first axis vector and a second axis vector are obtained.

After the corresponding axis vectors of the standard axis net in the first drawing model and the second drawing model are determined, the rotation amount between the axes is calculated based on the two axis vectors, the rotation amount is obtained by calculating the cosine values of the two axes, the rotation amount of the drawing model is determined according to the cosine value, and finally, position alignment between the axis nets of the two drawing models is realized.

In some embodiments, the calculating a cosine value between the axis vectors corresponding to the first drawing model and the second drawing model, and rotationally aligning the first drawing model and the second drawing model according to the cosine value includes: calculating the cosine value between the axis vectors according to the axis vectors corresponding to the same axes in the first standard axis net and the second standard axis net; determining an angle or radian by which the first standard axis net or the second standard axis net is required to rotate when the first standard axis net and the second standard axis net are aligned according to the cosine value; the cosine value between the axis vectors being used for representing a position alignment degree between the axis nets of the first drawing model and the second drawing model, and the smaller the cosine value, the more aligned the positions of the axis nets.

Specifically, the cosine value is calculated for the axis vectors corresponding to the two axis nets, and when the cosine value exists between the two axis nets, the positions of the drawing models before and after the modification are deflected; that is, the axis nets of the drawing models before and after the modification have the rotation amount in the space, and meanwhile, the cosine value also indicates the rotation amount, and the closer the cosine value is to 0, the smaller the rotation amount of the axis net is, and the smaller the deflection of the drawing models before and after the modification is.

Further, since the coordinate alignment of the drawing models in the world coordinate system is realized using the base point alignment, by calculating the vector between the standard axis nets, the rotation amounts of the two drawing models in the world coordinate system can be further determined; that is, by calculating the cosine value between the axis vectors, the rotation amounts of the two axis nets in the same space are determined, and the rotation amounts include rotation angles or radians, and then, the first standard axis net or the second standard axis net is rotated based on the determined rotation angle or radian (rotation of the standard axis net is rotation of the drawing model), such that spatial positions of the two drawing models can be aligned.

Figure 4:
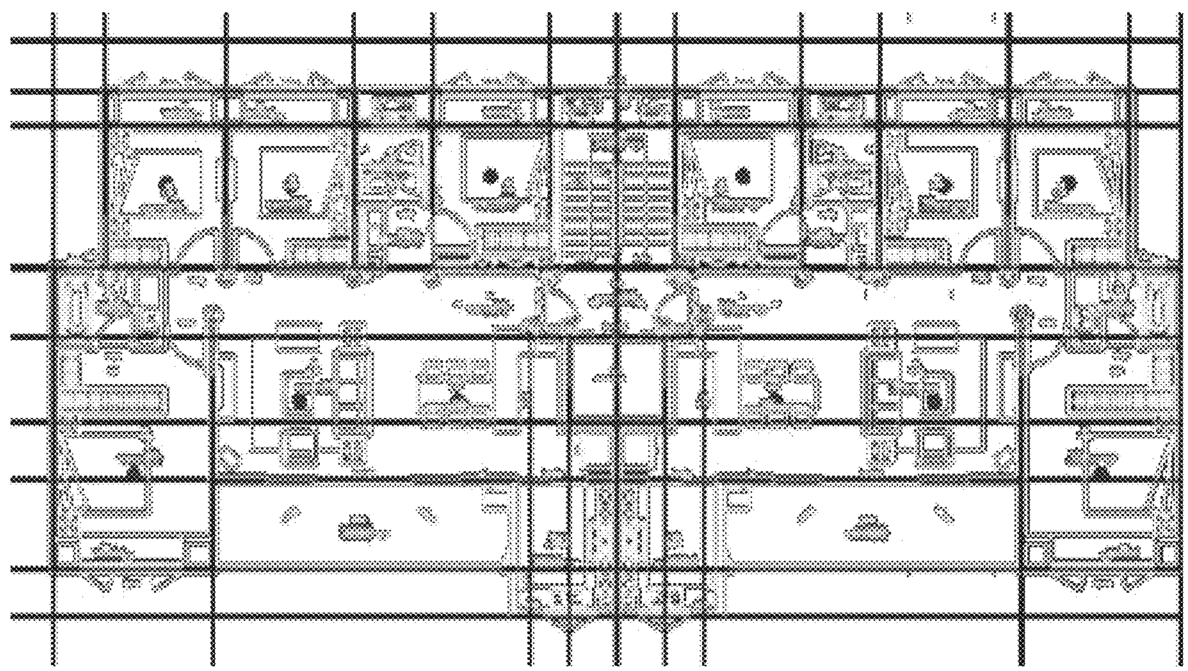
FIG. 4 is a schematic diagram of a drawing model after realization of rotational alignment based on a cosine value of an axis vector in an embodiment of the present disclosure.

FIG. 4 is a schematic diagram of the drawing model after realization of the rotational alignment based on the cosine value of the axis vector in the embodiment of the present disclosure. As shown in FIG. 4, in the schematic diagram of the drawing model, the cosine value is determined for the axis vector of the standard axis net, the rotation amount of the axis net is determined according to the cosine value, the rotation angle or radian is determined according to the rotation amount, and the drawing model is rotationally aligned according to the rotation angle and radian, such that unmodified parts in the drawing models in different layers have no rotation amount in the space.

In some embodiments, the cosine value between the axis vectors is calculated using the following formula:

$$\cos(\theta) = \frac{a \cdot b}{\|a\| \times \|b\|}$$

wherein cos (θ) represents the cosine value between the axis vectors, & represents the axis vector corresponding to the first standard axis net, and b represents the axis vector corresponding to the second standard axis net.

In some embodiments, the displaying lines and points in the first drawing model after the rotational alignment in a first color, displaying lines and points in the second drawing model after the rotational alignment in a second color, the first color and the second color being different colors, and checking the drawing models by color mixing distinguishing includes: after the first drawing model and the second drawing model are rotationally aligned, when the lines and points at the same positions in the same drawing model are in a third color, and the lines and points at different positions in the same drawing model are in the first color or the second color, checking the drawing model on the basis of a uniform color and a different color presented by the lines and points; the first color being red, the second color being green, and the third color being yellow.

Specifically, after the drawing models are rotationally aligned based on the cosine value of the axis vector of the standard axis net, since the colors of the geometric figures (such as the lines and points) in different drawing models are different, for example, the color of the geometric figure in the first drawing model is red, and the color of the geometric figure in the second drawing model is green, after the first drawing model and the second drawing model are rotationally aligned, the geometric figures at the same positions (i.e., the geometric figures with positions unchanged before and after the modification) are displayed to be yellow after overlapped, and the geometric figures at different positions (i.e., the geometric figures with positions changed before and after the modification) are still displayed in respective corresponding colors.

Further, based on the difference between the colors of the geometric figures at the same position and different positions, the geometric figures with the positions changed before and after the modification and the geometric figures with the positions unchanged before and after the modification can be quickly distinguished, the changed position indicates that the geometric figure or geometric element is modified, and the unchanged position indicates that the geometric figure or geometric element is not modified.

In some embodiments, the checking the drawing models according to the uniform color and the different color presented by the geometric elements includes: in a case where the uniform color is used for representing the geometric elements with the same positions and shapes in the first drawing model and the second drawing model, the different color is used for representing the geometric elements with different positions and shapes in the first drawing model and the second drawing model, the geometric elements corresponding to the uniform color are not changed before and after the drawing models are modified, and the geometric elements corresponding to the different color are changed before and after the drawing models are modified, checking the changed geometric elements to determine whether the modification of the changed geometric elements meets a modification requirement.

Specifically, based on the color mixing principle, the geometric elements with the changed positions present respective colors, the geometric elements with the unchanged positions present the same color, and based on the color difference, the checker can be helped to quickly position the modified regions and positions in the drawing models, so as to determine the modified figures in the drawing models. When the parts in the drawing models presenting respective colors are checked, the checker is required to judge whether the modification of the drawing model meets the requirements according to the geometric figures or geometric elements before and after the modification.

In the technical solution according to the embodiment of the present disclosure, the consistency of the drawing models is judged by calculating the MD5 values of the drawing model files, and when the drawing models are judged to be inconsistent, the drawing models of the versions before and after the modification can realize the base point alignment in the same reference coordinate system using the alignment base point, and the geometric figures of the same parts in the drawing models have no rotation vector in the space by using the cosine value determined by the axis vector of the standard axis net, so as to realize the position alignment of the axis nets, and finally, by using the color mixing principle, the geometric figures at the same positions present the uniform color, and the geometric figures at different positions still keep the original colors, thereby helping the checker to quickly position the modified region and position to facilitate the checker to check the modification of the drawing models according to modification requirements. With the present disclosure, an intelligent drawing model check can be realized, the workload and time consumption of the drawing model check can be reduced, missing and error problems can be avoided, and the difference between the drawing models before and after modification can be visually presented, so as to help the checker to quickly position the modified region and improve the efficiency of checking the drawing model.

In the first embodiment described above, differentiated display of the geometric figures at different positions is realized based on the color mixing mode, and the second embodiment of the present disclosure provides another way in which the positions of the changed geometric elements are determined, which is described below with reference to a specific embodiment.

Second Embodiment

FIG. 5 is a schematic flowchart of an intelligent drawing-model checking method according to a second embodiment of the present disclosure. The intelligent drawing-model checking method in FIG. 5 may be executed by a server or a terminal, and the server may be a background server corresponding to a drawing model reviewing system. As shown in FIG. 5, the intelligent drawing-model checking method may specifically include:

S501: acquiring a first drawing model and a second drawing model obtained by modifying the first drawing model, and determining an alignment base point according to the first drawing model and the second drawing model;

S502: aligning the first drawing model and the second drawing model into a same reference coordinate system based on the alignment base point, and respectively displaying the first drawing model and the second drawing model in different layers in a drawing model corresponding to the reference coordinate system;

S503: determining corresponding axis vectors in the first drawing model and the second drawing model according to a preset standard axis net, calculating a first cosine value between the axis vectors corresponding to the first drawing model and the second drawing model, and rotationally aligning at least one of the first drawing model and the second drawing model according to the first cosine value;

S504: sequentially traversing geometric elements in the first drawing model and the second drawing model after the rotational alignment to calculate a vector of each geometric element, and respectively calculating second cosine values between the vectors of the closest geometric elements in the first drawing model and the second drawing model based on the vectors of the geometric elements; and S505: taking the geometric elements with the second cosine values larger than a preset threshold as the geometric elements with different positions, rendering the geometric elements with different positions, and checking the drawing models according to the rendered geometric elements.

Specifically, contents of steps S501 to S503 in the second embodiment are the same as the contents of steps S201 to S203 in the first embodiment, and therefore, a detailed implementation process of steps S501 to S503 is not fully described in the second embodiment, and for the detailed implementation process of the steps, reference is made to the description of the steps in the first embodiment.

In some embodiments, the sequentially traversing geometric elements in the first drawing model and the second drawing model after the rotational alignment to calculate a vector of each geometric element includes: acquiring the geometric elements of the first drawing model and the geometric elements of the second drawing model corresponding to different layers in the same drawing model, and sequentially calculating the vector corresponding to each geometric element in a traversing mode according to starting point coordinates and end point coordinates of the geometric elements; the geometric elements being line elements, and the line elements including straight lines, curved lines, broken lines and dotted lines.

Specifically, after the axis vectors of the standard axis net are used for realizing the rotational alignment of the drawing models, the vector corresponding to each geometric element is calculated by sequentially traversing the geometric elements under different layers in the same drawing model, and the geometric elements refer to line-type geometric elements; that is, all the lines in the first drawing model and the second drawing model are sequentially traversed, and the geometric vector corresponding to each line is calculated according to the starting point coordinate and the end point coordinate of each line.

It should be noted that it is a known technology to calculate the geometric vector of the line according to the starting point coordinate and the end point coordinate of the line in the coordinate system, the vector calculation is not a core invention point of the present disclosure, and therefore, a specific operation process of the vector calculation is not disclosed in detail in the present disclosure, and a calculation manner of the vector does not constitute a limitation on the present solution.

In some embodiments, the respectively calculating second cosine values between the vectors of the closest geometric elements in the first drawing model and the second drawing model based on the vectors of the geometric elements includes: determining a center point coordinate corresponding to each geometric element in the first drawing model and the second drawing model, determining the closest geometric elements according to connecting lines between the center point coordinates, and calculating the second cosine values between the vectors of the closest geometric elements.

Specifically, in order to determine the two geometric elements in the drawing model the cosine value between the vectors of which is calculated, two elements with a shortest geometric distance are required to be determined according to the coordinates of center points of the geometric elements in each drawing model, and the closer the center point coordinates, the higher the probability that the two geometric elements coincide in the two drawing models, that is, the higher the probability of the geometric elements belonging to the same position. When a distance of the connecting line between the coordinates of the center points of the two geometric elements is smaller than a preset distance threshold, a corresponding relationship between the two geometric elements is established, the second cosine value is calculated, the two geometric elements correspond to the geometric elements in the two drawing models but not different geometric elements in the same drawing model.

Further, according to the second cosine value, the geometric elements having the same position and the geometric elements having changed positions are determined; that is, when the second cosine value is 0, the positions of the geometric elements are the same, and therefore, the positions and shapes of the geometric elements in the drawing models before and after the modification are not changed, and when the second cosine value is not equal to 0, the positions of the geometric elements are different, and therefore, the positions or shapes of the geometric elements in the drawing models before and after the modification are changed. The geometric elements having the same position and the geometric elements having different positions before and after the modification may be determined based on the second cosine value.

In some embodiments, the rendering the geometric elements with different positions, and checking the drawing models according to the rendered geometric elements includes: rendering the geometric elements with different positions into geometric elements with preset colors, the geometric elements with the preset colors being used for representing the geometric elements which are changed before and after the drawing model is modified, and checking the changed geometric elements to determine whether the modification of the changed geometric elements meets the modification requirement.

Specifically, after the geometric elements having changed positions are determined, the modified geometric elements may be determined, and color rendering is performed on the geometric elements with the changed positions; for example, the geometric elements are rendered to be red, and the geometric elements with unchanged positions may not be rendered or rendered in a uniform color; based on the color difference, the checker can be helped to quickly position the modified region and position in the drawing model, so as to determine the modified figures in the drawing model. When the parts in the drawing models rendered in the specific colors are checked, the checker is required to judge whether the modification of the drawing model meets the requirements according to the geometric figures or geometric elements before and after the modification.

In the technical solution according to the embodiment of the present disclosure, compared with the first embodiment, after the rotational alignment of the drawing models is realized according to the first cosine value, the closest geometric elements are further judged, the second cosine value between the geometric elements is calculated, the positions of the changed geometric elements are determined based on the second cosine value, and the geometric elements with the changed positions are rendered, such that the checker can quickly position the modified region and position, and check the modification of the drawing model according to the modification requirement. With the present disclosure, an intelligent drawing model check can be realized, the workload and time consumption of the drawing model check can be reduced, missing and error problems can be avoided, and the difference between the drawing models before and after modification can be visually presented, so as to help the checker to quickly position the modified region and improve the efficiency of checking the drawing model.

An apparatus according to the embodiments of the present disclosure is described below, and may be configured to perform the method according to the embodiments of the present disclosure. For details not disclosed in the embodiments of the apparatus according to the present disclosure, reference is made to the embodiments of the method according to the present disclosure.

Figure 6:
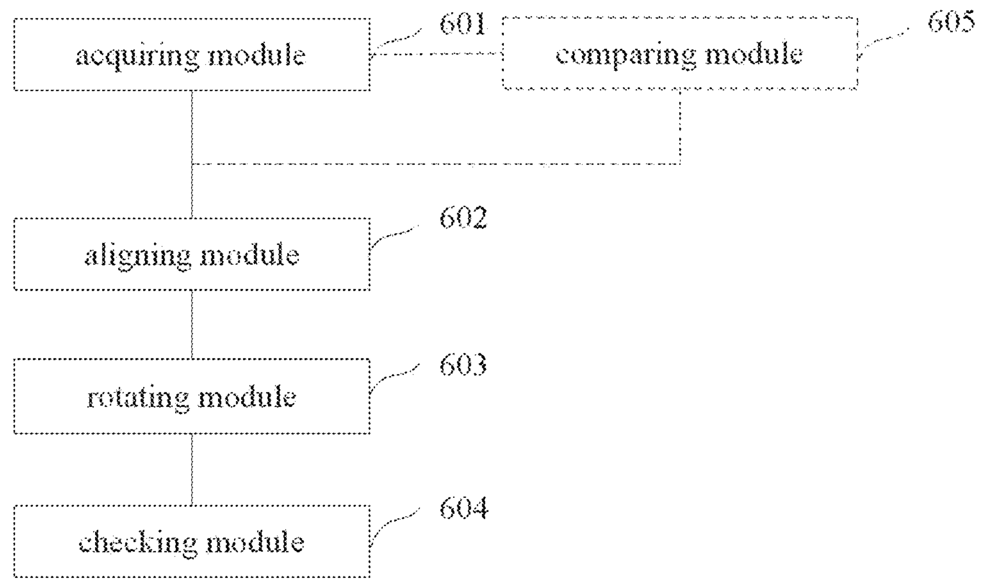
FIG. 6 is a schematic structural diagram of an intelligent drawing-model checking apparatus corresponding to the method of the first embodiment according to an embodiment of the present disclosure.

FIG. 6 is a schematic structural diagram of an intelligent drawing-model checking apparatus corresponding to the method of the first embodiment according to an embodiment of the present disclosure. As shown in FIG. 6, the intelligent drawing-model checking apparatus includes:

- an acquiring module 601 configured to acquire a first drawing model and a second drawing model obtained by modifying the first drawing model, and determine an alignment base point according to the first drawing model and the second drawing model;
- an aligning module 602 configured to align the first drawing model and the second drawing model into a same reference coordinate system based on the alignment base point, and respectively display the first drawing model and the second drawing model in different layers in a drawing model corresponding to the reference coordinate system;
- a rotating module 603 configured to determine corresponding axis vectors in the first drawing model and the second drawing model according to a preset standard axis net, calculate a cosine value between the axis vectors corresponding to the first drawing model and the second drawing model, and rotationally align at least one of the first drawing model and the second drawing model according to the cosine value; and
- a checking module 604 configured to display lines and points in the first drawing model after the rotational alignment in a first color, display lines and points in the second drawing model after the rotational alignment in a second color, the first color and the second color being different colors, and check the drawing models by color mixing distinguishing.

In some embodiments, before the alignment base point is determined according to the first drawing model and the second drawing model, a comparing module 605 in FIG. 6 performs a hash operation on the first drawing model and the second drawing model to obtain a first hash value and a second hash value corresponding to the first drawing model and the second drawing model respectively, and compares the first hash value with the second hash value; and when the first hash value and the second hash value are different, performs a check operation on the second drawing model.

In some embodiments, the acquiring module 601 in FIG. 6 takes a coordinate point in a world coordinate system corresponding to a coordinate origin in the first drawing model or the second drawing model as the alignment base point; or selects at least one axis net from the first drawing model or the second drawing model as an alignment axis net, and takes an axis intersection point in the alignment axis net as the alignment base point; the alignment axis net and the standard axis net being a same axis net or different axis nets, and the alignment axis net or the standard axis net including at least one group of horizontal axis and longitudinal axis.

In some embodiments, when the axis intersection point in the alignment axis net is used as the alignment base point, the aligning module 602 in FIG. 6 determines a coordinate corresponding to a first axis intersection point in the first drawing model, and determines a coordinate corresponding to a second axis intersection point in the second drawing model; and calculates an intersection point vector between the first axis intersection point and the second axis intersection point according to the coordinate of the first axis intersection point and the coordinate of the second axis intersection point, the intersection point vector being used for indicating a moving distance and direction of the first drawing model or the second drawing model when the first axis intersection point and the second axis intersection point are aligned; the first axis intersection point and the second axis intersection point being intersection points formed by the axes with same axis numbers.

In some embodiments, a drawing coordinate system corresponding to the first drawing model is used as the reference coordinate system, or a drawing coordinate system corresponding to the second drawing model is used as the reference coordinate system, or a drawing coordinate system corresponding to a third drawing model except the first drawing model and the second drawing model is used as the reference coordinate system.

In some embodiments, the rotating module 603 in FIG. 6 traverses the axis nets in the first drawing model and the second drawing model according to an axis number corresponding to the preset standard axis net, takes an axis net in the first drawing model corresponding to the axis number of the standard axis net as a first standard axis net, and takes an axis net in the second drawing model corresponding to the axis number of the standard axis net as a second standard axis net; and acquires starting point coordinates and end point coordinates which correspond to horizontal axes or longitudinal axes in the first standard axis net and the second standard axis net respectively, and calculates the axis vectors corresponding to the same axes in the first standard axis net and the second standard axis net respectively according to the starting point coordinates and the end point coordinates.

In some embodiments, the rotating module 603 in FIG. 6 calculates the cosine value between the axis vectors according to the axis vectors corresponding to the same axes in the first standard axis net and the second standard axis net; determines an angle or radian by which the first standard axis net or the second standard axis net is required to rotate when the first standard axis net and the second standard axis net are aligned according to the cosine value; the cosine value between the axis vectors being used for representing a position alignment degree between the axis nets of the first drawing model and the second drawing model, and the smaller the cosine value, the more aligned the positions of the axis nets.

In some embodiments, the cosine value between the axis vectors is calculated using the following formula:

$$\cos(\theta) = \frac{a \cdot b}{\|a\| \times \|b\|}$$

wherein cos (θ) represents the cosine value between the axis vectors, & represents the axis vector corresponding to the first standard axis net, and b represents the axis vector corresponding to the second standard axis net.

In some embodiments, the checking module 604 in FIG. 6: after the first drawing model and the second drawing model are rotationally aligned, when the lines and points at the same positions in the same drawing model are in a third color, and the lines and points at different positions in the same drawing model are in the first color or the second color, checks the drawing model on the basis of a uniform color and a different color presented by the lines and points; the first color being red, the second color being green, and the third color being yellow.

In some embodiments, the checking module 604 in FIG. 6: in a case where the uniform color is used for representing the geometric elements with the same positions and shapes in the first drawing model and the second drawing model, the different color is used for representing the geometric elements with different positions and shapes in the first drawing model and the second drawing model, the geometric elements corresponding to the uniform color are not changed before and after the drawing models are modified, and the geometric elements corresponding to the different color are changed before and after the drawing models are modified, checks the changed geometric elements to determine whether the modification of the changed geometric elements meets a modification requirement.

Figure 7:
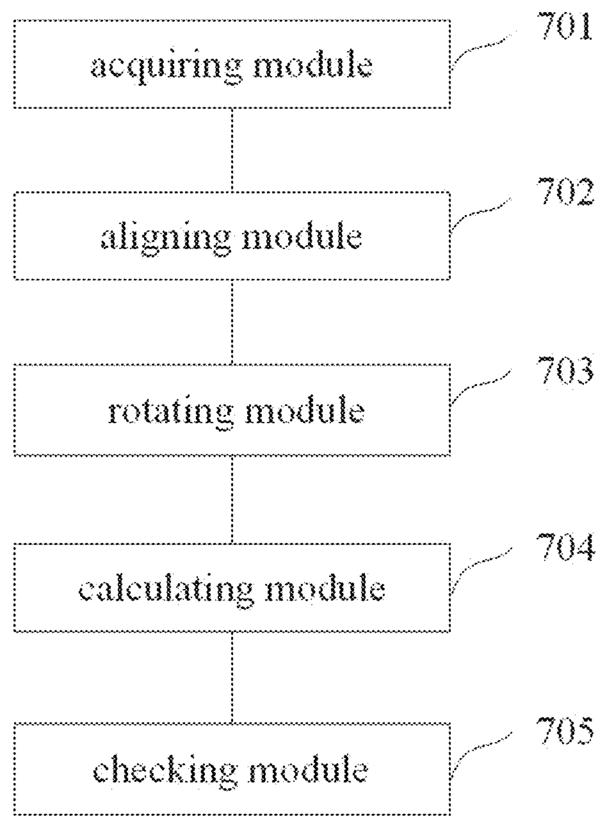
FIG. 7 is a schematic structural diagram of an intelligent drawing-model checking apparatus corresponding to the method of the second embodiment according to an embodiment of the present disclosure.

FIG. 7 is a schematic structural diagram of an intelligent drawing-model checking apparatus corresponding to the method of the second embodiment according to an embodiment of the present disclosure. As shown in FIG. 7, the intelligent drawing-model checking apparatus includes:

- an acquiring module 701 configured to acquire a first drawing model and a second drawing model obtained by modifying the first drawing model, and determine an alignment base point according to the first drawing model and the second drawing model;
- an aligning module 702 configured to align the first drawing model and the second drawing model into a same reference coordinate system based on the alignment base point, and respectively display the first drawing model and the second drawing model in different layers in a drawing model corresponding to the reference coordinate system;
- a rotating module 703 configured to determine corresponding axis vectors in the first drawing model and the second drawing model according to a preset standard axis net, calculate a first cosine value between the axis vectors corresponding to the first drawing model and the second drawing model, and rotationally align at least one of the first drawing model and the second drawing model according to the first cosine value;
- a calculating module 704 configured to sequentially traverse geometric elements in the first drawing model and the second drawing model after the rotational alignment to calculate a vector of each geometric element, and respectively calculate second cosine values between the vectors of the closest geometric elements in the first drawing model and the second drawing model based on the vectors of the geometric elements; and a checking module 705 configured to take the geometric elements with the second cosine values larger than a preset threshold as the geometric elements with different positions, render the geometric elements with different positions, and check the drawing models according to the rendered geometric elements.

In some embodiments, the calculating module 704 in FIG. 7 acquires the geometric elements of the first drawing model and the geometric elements of the second drawing model corresponding to different layers in the same drawing model, and sequentially calculates the vector corresponding to each geometric element in a traversing mode according to starting point coordinates and end point coordinates of the geometric elements; the geometric elements being line elements, and the line elements including straight lines, curved lines, broken lines and dotted lines.

In some embodiments, the calculating module 704 in FIG. 7 determines a center point coordinate corresponding to each geometric element in the first drawing model and the second drawing model, determines the closest geometric elements according to connecting lines between the center point coordinates, and calculates the second cosine values between the vectors of the closest geometric elements.

In some embodiments, the checking module 705 in FIG. 7 renders the geometric elements with different positions into geometric elements with preset colors, the geometric elements with the preset colors being used for representing the geometric elements which are changed before and after the drawing model is modified, and checks the changed geometric elements to determine whether the modification of the changed geometric elements meets the modification requirement.

It should be understood that, the sequence numbers of the steps in the foregoing embodiments do not imply an execution sequence, and the execution sequence of each process should be determined by functions and internal logic of the process, and should not constitute any limitation to the implementation process of the embodiments of the present disclosure.

Figure 8:
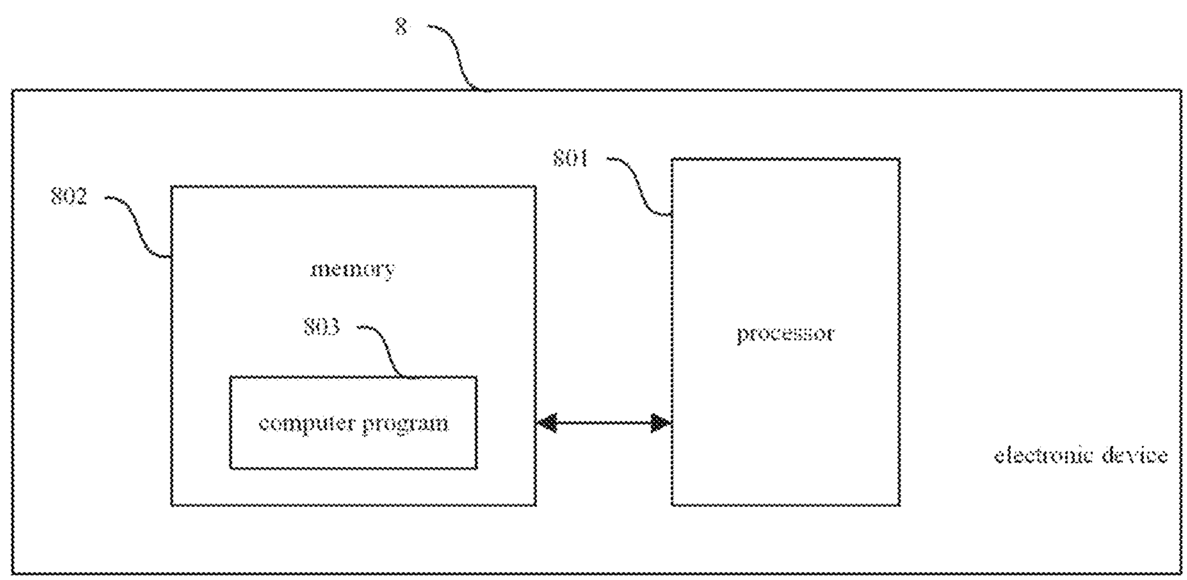
FIG. 8 is a schematic structural diagram of an electronic device 8 according to an embodiment of the present disclosure.

FIG. 8 is a schematic structural diagram of an electronic device 8 according to an embodiment of the present disclosure. As shown in FIG. 8, the electronic device 8 according to the present embodiment includes: a processor 801, a memory 802, and a computer program 803 stored in the memory 802 and executable on the processor 801. The steps in the various method embodiments described above are implemented when the processor 801 executes the computer program 803. Alternatively, the processor 801 achieves the functions of each module/unit in each apparatus embodiment described above when executing the computer program 803.

Exemplarily, the computer program 803 may be partitioned into one or more modules/units, which are stored in the memory 802 and executed by the processor 801 to complete the present disclosure. One or more of the modules/units may be a series of computer program instruction segments capable of performing specific functions, the instruction segments describing the execution of the computer program 803 in the electronic device 8.

The electronic device 8 may be a desktop computer, a notebook, a palm computer, a cloud server or another electronic device. The electronic device 8 may include, but is not limited to, the processor 801 and the memory 802. Those skilled in the art may understand that a structure shown in FIG. 8 is only an example of the electronic device 8 and does not limit the electronic device 8, which may include more or fewer components than those shown in the drawings, or some components may be combined, or a different component deployment may be used. For example, the electronic device may further include an input/output device, a network access device, a bus, or the like.

The processor 801 may be a Central Processing Unit (CPU), or other general-purpose processors, Digital Signal Processors (DSP), Application Specific Integrated Circuits (ASIC), Field-Programmable Gate Arrays (FPGA) or other programmable logic devices, discrete gates or transistor logic devices, discrete hardware components, etc. The general-purpose processor may be a microprocessor or the processor may be any general processor, or the like.

The memory 802 may be an internal storage unit of the electronic device 8, for example, a hard disk or memory of the electronic device 8. The memory 802 may also be an external storage device of the electronic device 8, such as a plug-in hard disk, a Smart Media Card (SMC), a Secure Digital (SD) Card, a Flash Card, or the like, configured on the electronic device 8. Further, the memory 802 may also include both the internal storage unit and the external storage device of the electronic device 8. The memory 802 is configured to store the computer program and other programs and data required by the electronic device. The memory 802 may be further configured to temporarily store data which has been or will be outputted.

It may be clearly understood by those skilled in the art that, for convenient and brief description, division of the above functional units and modules is used as an example for illustration. In practical application, the above functions can be allocated to different functional units and modules and implemented as required; that is, an internal structure of the apparatus is divided into different functional units or modules to accomplish all or some of the functions described above. The functional units or modules in the embodiments may be integrated into one processing unit, or each of the units may exist alone physically, or two or more units are integrated into one unit, and the integrated unit may be implemented in a form of hardware, or may also be implemented in a form of a software functional unit. In addition, specific names of all the functional units or modules are merely for facilitating the differentiation, but are not intended to limit the protection scope of this application. For a specific working process of the units or modules in the above system, reference may be made to the corresponding process in the foregoing method embodiments, which is not repeated herein.

In the above embodiments, the description of each embodiment has its own emphasis. For a part not described in detail in one embodiment, reference may be made to relevant description of other embodiments.

Those of ordinary skill in the art would appreciate that the units and algorithmic steps of the examples described in combination with the embodiments disclosed herein can be implemented by electronic hardware or a combination of computer software and electronic hardware. Whether these functions are performed by hardware or software depends on a specific application and design constraints of the technical solution. Technical professionals may achieve the described functions in different methods for each particular application, but such implementation should not be considered beyond the scope of the present disclosure.

In the embodiments according to the present disclosure, it is to be understood that the disclosed apparatus/computer device and method can be implemented in other ways. For example, the embodiment of the apparatus/computer device described above is merely schematic. For example, the division of the modules or units is merely logical function division, and there may be other division manners in an actual implementation. For example, a plurality of units or components may be combined or integrated into another system, or some features may be ignored or not performed. In addition, the displayed or discussed mutual coupling or direct coupling or communication connection may be implemented by using some interfaces. The indirect coupling or communication connection between apparatuses or units may be implemented in an electric form, a mechanical form, or other forms.

The units described as separate parts may or may not be physically separate, and parts displayed as units may or may not be physical units, may be located at one position, or may be distributed on a plurality of network units. Some or all of the units may be selected according to actual needs to achieve the objectives of the solutions of the embodiments.

In addition, the functional units in the embodiments of the present disclosure may be integrated into one processing unit, or each of the units may exist alone physically, or two or more units are integrated into one unit. The integrated unit may be implemented in a form of hardware or in a form of a software functional unit.

The integrated module/unit may be stored in a computer-readable storage medium when implemented in the form of the software functional unit and sold or used as a separate product. Based on such understanding, all or some of the processes in the method according to the above embodiments may be realized in the present disclosure, or completed by the computer program instructing related hardware, the computer program may be stored in the computer-readable storage medium, and when the computer program is executed by the processor, the steps of the above method embodiments may be realized. The computer program may include a computer program code, which may be in a form of a source code, an object code or an executable file or in some intermediate forms. The computer-readable medium may include any entity or apparatus capable of carrying the computer program code, a recording medium, a USB flash drive, a removable hard disk, a magnetic disk, an optical disk, a computer memory, a Read-Only Memory (ROM), a Random Access Memory (RAM), an electrical carrier signal, a telecommunication signal, a software distribution medium, and so on. It should be noted that content included in the computer-readable medium may be appropriately increased or decreased according to requirements of legislation and patent practice in a jurisdiction, for example, in some jurisdictions, according to legislation and patent practice, the computer-readable medium does not include the electrical carrier signal and the telecommunication signal.

The above embodiments are merely intended to describe the technical solutions of the present disclosure, but not to limit the present disclosure. Although the present disclosure is described in detail with reference to the foregoing embodiments, those of ordinary skill in the art should understand that they may still make modifications to the technical solutions described in the foregoing embodiments or make equivalent replacements to some technical features thereof. Such modifications or replacements do not cause the essence of the corresponding technical solutions to depart from the spirit and scope of the technical solutions of the embodiments of the present disclosure, and should be included in the protection scope of the present disclosure.

What is claimed is:

1. An intelligent drawing-model checking method, comprising:

acquiring a first drawing model and a second drawing model obtained by modifying the first drawing model, and determining an alignment base point according to the first drawing model and the second drawing model;

aligning the first drawing model and the second drawing model into a same reference coordinate system based on the alignment base point, and respectively displaying the first drawing model and the second drawing model in different layers in a drawing model corresponding to the reference coordinate system;

determining corresponding axis vectors in the first drawing model and the second drawing model according to a preset standard axis net, calculating a cosine value between the axis vectors corresponding to the first drawing model and the second drawing model, and rotationally aligning at least one of the first drawing model and the second drawing model according to the cosine value; and displaying lines and points in the first drawing model after the rotational alignment in a first color, displaying lines and points in the second drawing model after the rotational alignment in a second color, the first color and the second color being different colors, and checking the drawing models by color mixing distinguishing.

2. The method according to claim 1, before the determining an alignment base point according to the first drawing model and the second drawing model, further comprising:

performing a hash operation on the first drawing model and the second drawing model to obtain a first hash value and a second hash value corresponding to the first drawing model and the second drawing model respectively, and comparing the first hash value with the second hash value; and when the first hash value and the second hash value are different, performing a check operation on the second drawing model.

3. The method according to claim 1, wherein the determining an alignment base point according to the first drawing model and the second drawing model comprises:

taking a coordinate point in a world coordinate system corresponding to a coordinate origin in the first drawing model or the second drawing model as the alignment base point; or selecting at least one axis net from the first drawing model or the second drawing model as an alignment axis net, and taking an axis intersection point in the alignment axis net as the alignment base point;

the alignment axis net and the standard axis net being a same axis net or different axis nets, and the alignment axis net or the standard axis net comprising at least one group of horizontal axis and longitudinal axis.

4. The method according to claim 3, wherein when the axis intersection point in the alignment axis net is used as the alignment base point, the aligning the first drawing model and the second drawing model into a same reference coordinate system based on the alignment base point comprises:

determining a coordinate corresponding to a first axis intersection point in the first drawing model, and determining a coordinate corresponding to a second axis intersection point in the second drawing model; and calculating an intersection point vector between the first axis intersection point and the second axis intersection point according to the coordinate of the first axis intersection point and the coordinate of the second axis intersection point, the intersection point vector being used for indicating a moving distance and direction of the first drawing model or the second drawing model when the first axis intersection point and the second axis intersection point are aligned;

the first axis intersection point and the second axis intersection point being intersection points formed by the axes with same axis numbers.

5. The method according to claim 1, wherein a drawing coordinate system corresponding to the first drawing model is used as the reference coordinate system, or a drawing coordinate system corresponding to the second drawing model is used as the reference coordinate system, or a drawing coordinate system corresponding to a third drawing model except the first drawing model and the second drawing model is used as the reference coordinate system.

6. The method according to claim 1, wherein the determining corresponding axis vectors in the first drawing model and the second drawing model according to a preset standard axis net comprises:

traversing the axis nets in the first drawing model and the second drawing model according to an axis number corresponding to the preset standard axis net, taking an axis net in the first drawing model corresponding to the axis number of the standard axis net as a first standard axis net, and taking an axis net in the second drawing model corresponding to the axis number of the standard axis net as a second standard axis net; and acquiring starting point coordinates and end point coordinates which correspond to horizontal axes or longitudinal axes in the first standard axis net and the second standard axis net respectively, and calculating the axis vectors corresponding to the same axes in the first standard axis net and the second standard axis net respectively according to the starting point coordinates and the end point coordinates.

7. The method according to claim 6, wherein calculating a cosine value between the axis vectors corresponding to the first drawing model and the second drawing model, and rotationally aligning at least one of the first drawing model and the second drawing model according to the cosine value comprises:

calculating the cosine value between the axis vectors according to the axis vectors corresponding to the same axes in the first standard axis net and the second standard axis net;

determining an angle or radian by which the first standard axis net or the second standard axis net is required to rotate when the first standard axis net and the second standard axis net are aligned according to the cosine value;

the cosine value between the axis vectors being used for representing a position alignment degree between the axis nets of the first drawing model and the second drawing model, and the smaller the cosine value, the more aligned the positions of the axis nets.

8. The method according to claim 7, wherein the cosine value between the axis vectors is calculated using the following formula:

$$\cos(\theta) = \frac{a \cdot b}{\|a\| \times \|b\|}$$

wherein cos (θ) represents the cosine value between the axis vectors, a represents the axis vector corresponding to the first standard axis net, and b represents the axis vector corresponding to the second standard axis net.

9. The method according to claim 1, wherein the displaying lines and points in the first drawing model after the rotational alignment in a first color, displaying lines and points in the second drawing model after the rotational alignment in a second color, the first color and the second color being different colors, and checking the drawing models by color mixing distinguishing comprises:

after the first drawing model and the second drawing model are rotationally aligned, when the lines and points at the same positions in the same drawing model are in a third color, and the lines and points at different positions in the same drawing model are in the first color or the second color, checking the drawing model on the basis of a uniform color and a different color presented by the lines and points;

the first color being red, the second color being green, and the third color being yellow.

10. The method according to claim 9, wherein the checking the drawing models on the basis of the uniform color and the different color presented by the lines and points comprises:

in a case where the uniform color is used for representing the lines and points with the same positions and shapes in the first drawing model and the second drawing model, the different color is used for representing the lines and points with different positions and shapes in the first drawing model and the second drawing model, the lines and points corresponding to the uniform color are not changed before and after the drawing models are modified, and the lines and points corresponding to the different color are changed before and after the drawing models are modified, checking the changed lines and points to determine whether the modification of the changed lines and points meets a modification requirement.

11. An intelligent drawing-model checking method, comprising:

acquiring a first drawing model and a second drawing model obtained by modifying the first drawing model, and determining an alignment base point according to the first drawing model and the second drawing model;

aligning the first drawing model and the second drawing model into a same reference coordinate system based on the alignment base point, and respectively displaying the first drawing model and the second drawing model in different layers in a drawing model corresponding to the reference coordinate system;

determining corresponding axis vectors in the first drawing model and the second drawing model according to a preset standard axis net, calculating a first cosine value between the axis vectors corresponding to the first drawing model and the second drawing model, and rotationally aligning at least one of the first drawing model and the second drawing model according to the first cosine value;

sequentially traversing geometric elements in the first drawing model and the second drawing model after the rotational alignment to calculate a vector of each geometric element, and respectively calculating second cosine values between the vectors of the closest geometric elements in the first drawing model and the second drawing model based on the vectors of the geometric elements; and taking the geometric elements with the second cosine values larger than a preset threshold as the geometric elements with different positions, rendering the geometric elements with different positions, and checking the drawing models according to the rendered geometric elements.

12. The method according to claim 11, wherein the sequentially traversing geometric elements in the first drawing model and the second drawing model after the rotational alignment to calculate a vector of each geometric element comprises:

acquiring the geometric elements of the first drawing model and the geometric elements of the second drawing model corresponding to different layers in the same drawing model, and sequentially calculating the vector corresponding to each geometric element in a traversing mode according to starting point coordinates and end point coordinates of the geometric elements;

the geometric elements being line elements, and the line elements comprising straight lines, curved lines, broken lines and dotted lines.

13. The method according to claim 11, wherein the respectively calculating second cosine values between the vectors of the closest geometric elements in the first drawing model and the second drawing model based on the vectors of the geometric elements comprises:

determining a center point coordinate corresponding to each geometric element in the first drawing model and the second drawing model, determining the closest geometric elements according to connecting lines between the center point coordinates, and calculating the second cosine values between the vectors of the closest geometric elements.

14. The method according to claim 11, wherein the rendering the geometric elements with different positions, and checking the drawing models according to the rendered geometric elements comprises:

rendering the geometric elements with different positions into geometric elements with preset colors, the geometric elements with the preset colors being used for representing the geometric elements which are changed before and after the drawing model is modified, and checking the changed geometric elements to determine whether the modification of the changed geometric elements meets the modification requirement.

15. An intelligent drawing-model checking apparatus, comprising:

an acquiring module configured to acquire a first drawing model and a second drawing model obtained by modifying the first drawing model, and determine an alignment base point according to the first drawing model and the second drawing model;

an aligning module configured to align the first drawing model and the second drawing model into a same reference coordinate system based on the alignment base point, and respectively display the first drawing model and the second drawing model in different layers in a drawing model corresponding to the reference coordinate system;

a rotating module configured to determine corresponding axis vectors in the first drawing model and the second drawing model according to a preset standard axis net, calculate a cosine value between the axis vectors corresponding to the first drawing model and the second drawing model, and rotationally align at least one of the first drawing model and the second drawing model according to the cosine value; and a checking module configured to display lines and points in the first drawing model after the rotational alignment in a first color, display lines and points in the second drawing model after the rotational alignment in a second color, the first color and the second color being different colors, and check the drawing models by color mixing distinguishing.

* * * * *